US009378791B2

(12) United States Patent
Morgan et al.

(10) Patent No.: US 9,378,791 B2
(45) Date of Patent: Jun. 28, 2016

(54) APPARATUSES AND METHODS FOR CONTROLLING A CLOCK SIGNAL PROVIDED TO A CLOCK TREE

(71) Applicant: Micron Technology, Inc., Boise, ID (US)

(72) Inventors: Donald M. Morgan, Meridian, ID (US); Jongtae Kwak, Boise, ID (US); Jeffrey P. Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/800,512

(22) Filed: Jul. 15, 2015

(65) Prior Publication Data

US 2015/0318032 A1   Nov. 5, 2015

Related U.S. Application Data

(62) Division of application No. 13/744,177, filed on Jan. 17, 2013, now Pat. No. 9,087,570.

(51) Int. Cl.
*G11C 7/22* (2006.01)
*G11C 7/10* (2006.01)
*H03K 19/00* (2006.01)

(52) U.S. Cl.
CPC ............... *G11C 7/222* (2013.01); *G11C 7/109* (2013.01); *G11C 7/1057* (2013.01); *G11C 7/1084* (2013.01); *G11C 7/1087* (2013.01); *H03K 19/0005* (2013.01)

(58) Field of Classification Search
CPC ..... G11C 7/222; G11C 7/1057; G11C 7/1084; G11C 7/1087; G11C 7/109; H03K 19/0005
USPC ..................... 365/191, 158, 189.16
See application file for complete search history.

(56) References Cited

U.S. PATENT DOCUMENTS

| | | | |
|---|---|---|---|
| 6,865,684 B2 | 3/2005 | Atkinson | |
| 8,824,222 B2 | 9/2014 | Ware et al. | |
| 2006/0158214 A1* | 7/2006 | Janzen | G11C 7/1051 326/30 |
| 2010/0235658 A1 | 9/2010 | Nishida | |
| 2010/0325469 A1 | 12/2010 | Yokoyama et al. | |
| 2011/0205832 A1* | 8/2011 | Jeon | G11C 7/1057 365/233.16 |
| 2012/0179924 A1 | 7/2012 | Sugiyama et al. | |
| 2013/0194013 A1 | 8/2013 | Kwak | |
| 2013/0322162 A1 | 12/2013 | Lee et al. | |
| 2013/0342254 A1 | 12/2013 | Mazumder et al. | |

* cited by examiner

*Primary Examiner* — Fernando Hidalgo
(74) *Attorney, Agent, or Firm* — Dorsey & Whitney LLP

(57) ABSTRACT

Apparatuses, sense circuits, and methods for controlling a clock signal to a clock tree is described. An example apparatus includes a consecutive write command detection circuit configured to detect whether a next write command is received within a consecutive write command period of a current write command responsive to the current write command provided at an output of the write command register. The example apparatus further includes a clock signal control circuit coupled to the consecutive write command detection circuit and configured to control a clock signal to an input/output (I/O) latch based on whether the consecutive write command detection circuit detects that the next write command is within the consecutive write command period.

17 Claims, 6 Drawing Sheets

APPARATUSES AND METHODS FOR CONTROLLING A CLOCK SIGNAL PROVIDED TO A CLOCK TREE

CROSS-REFERENCE TO RELATED APPLICATION

This application is a divisional of pending U.S. patent application Ser. No. 13/744,177 filed on Jan. 17, 2013. This application is incorporated by reference herein in its entirety and for all purposes.

TECHNICAL FIELD

Embodiments of the invention relate generally to electronic memories, and more particularly, in one or more of the illustrated embodiments, to controlling a clock signal provided to a clock tree during execution of consecutive write commands.

BACKGROUND OF THE INVENTION

Advances in technology have resulted in smaller and more powerful computing devices. For example, there currently exist a variety of portable personal computing devices, including wireless computing devices, such as portable wireless telephones, personal digital assistants (PDAs), and paging devices. As the devices become more portable, power consumption and speed of components within a computing device become important factors in design considerations.

In some memory architectures, power savings can be achieved during consecutive write operations by controlling the timing of the operation of on-die termination (ODT) circuitry by distributing a control signal, for example, through a signal tree, to the ODT circuitry associated with the input/output (I/O) nodes of a memory during write operations. Although this approach may result in decreased power consumption, as well as savings in surface area, timing accuracy may be sacrificed. As memory architecture become faster, timing tolerances become tighter to a point where the reduced timing accuracy resulting from distributing the control signal to the ODT circuitry through a signal tree becomes insufficient. The timing of the operation of ODT circuitry may be controlled more accurately by using I/O latches located more closely to the ODT circuitry associated with the I/O nodes, however, this may result in increased power consumption.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
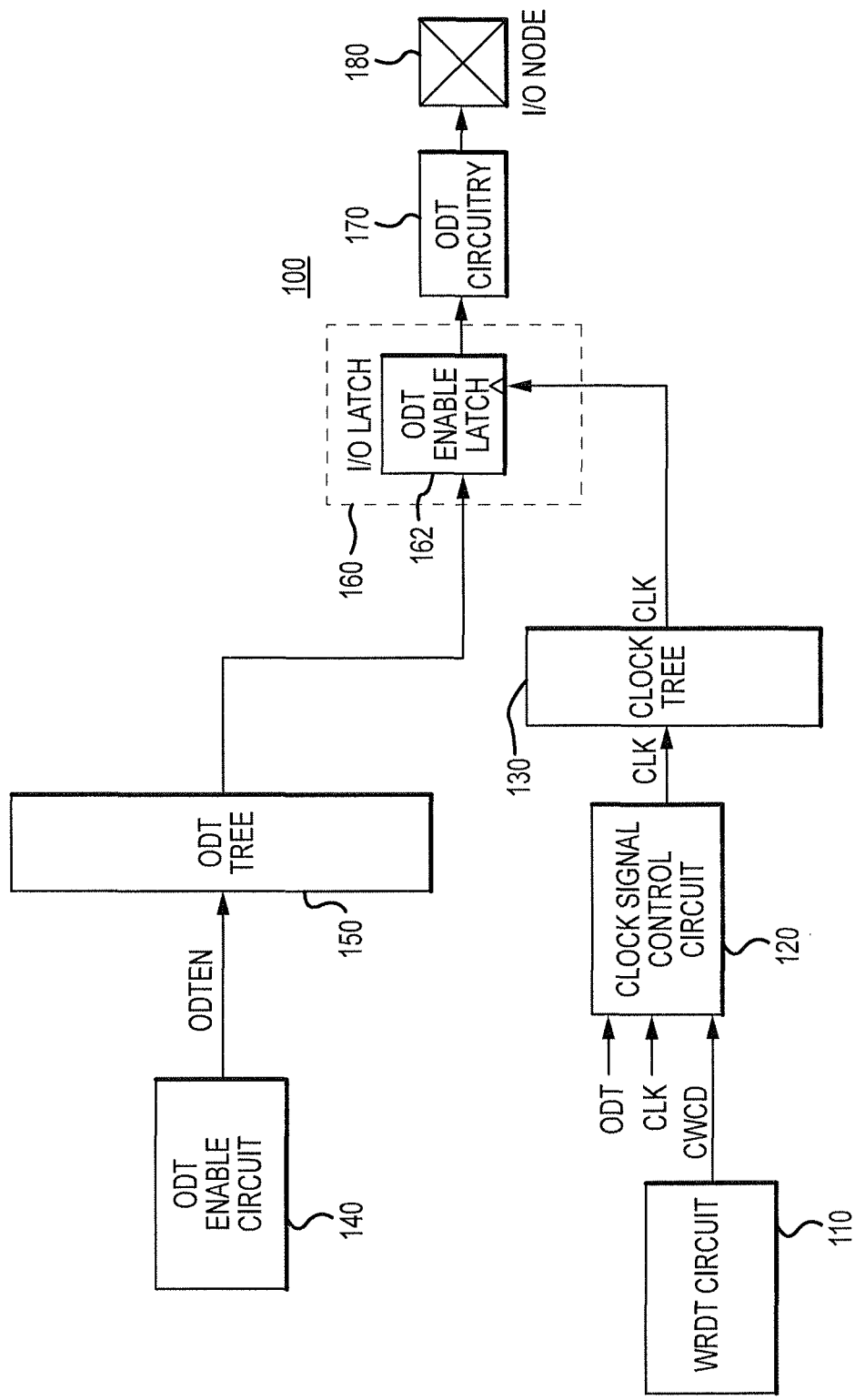
FIG. 1 is a block diagram of a particular illustrative embodiment of an apparatus including a consecutive write detection circuit.

Referring to FIG. 1, a particular illustrative embodiment of an apparatus including a consecutive write detection circuit is disclosed and generally designated 100. The apparatus may be an integrated circuit, a memory device, a memory system, an electronic device or system, a smart phone, a tablet, a computer, a server, etc. The apparatus 100 may control a clock signal provided to a clock tree during processing of consecutive write commands, for example, by disabling or enabling the clock signal. The apparatus 100 may include a consecutive write command detection circuit WRDT 110 that is configured to detect consecutive write commands and to provide a consecutive write command detected signal CWCD to a clock signal control circuit 120. The clock signal control circuit 120 may be configured to provide a clock signal CLK through a clock tree 130 to an ODT enable latch 162 of a set of input/output (I/O) latches 160 based on an on-die termination (ODT) signal ODT and the CWCD signal. An ODT enable signal ODTEN may be provided to the ODT enable latch 162 from an ODT enable circuit 140 via an ODT tree 150. The ODT enable latch 162 may provide the ODTEN signal to ODT circuitry 170 associated with an I/O node 180 based on the CLK signal.

The WRDT circuit 110 may be configured to provide the CWCD signal to the clock signal control circuit 120. A value of the CWCD signal may be based on whether consecutive write commands have been detected. The ODT signal received at the clock signal control circuit 120 may be asserted based on a write command. The clock signal control circuit 120 may provide the CLK signal to the clock tree 130 based on the ODT signal and the CWCD signal. The clock tree 130 may provide the CLK signal to one or more sets of input/output (I/O) latches, such as the set of I/O latches 160. While FIG. 1 depicts the set of I/O latches 160 including a single latch (e.g., the ODT enable latch 162), the set of I/O latches 160 may include additional latches, to, for example, facilitate additional memory operations (e.g., a read operation). Further, while FIG. 1 depicts a single I/O node 180 with associated ODT circuitry 170 and an associated set of I/O latches 160, the apparatus 100 may include a plurality of I/O nodes, each associated with respective ODT circuitry and a respective set of I/O latches.

The ODT enable circuit 140 may provide the ODTEN signal to the ODT tree 150. A value of the ODTEN signal may be based on a write operation signal (not shown) provided to the ODT enable circuit 140. In an embodiment, the write operation signal indicates whether a write operation is being executed. In an embodiment, the write operation signal may be based on a write command. The ODT tree 150 may provide the ODTEN signal to an ODT enable latch of one or more sets of I/O latches, such as the ODT enable latch 162 of the set of I/O latches 160. The ODT enable latch 162 may be configured to provide the ODTEN signal to ODT circuitry 170 associated with the I/O node 180 responsive to the CLK signal. As explained above, the set of I/O latches 160 may include additional latches (not shown) configured to provide signals related to memory operations.

In operation, the ODT signal received at the clock signal control circuit 120 may be asserted based on a write command. Further, the ODT enable circuit 140 may be configured to assert the ODTEN signal based on the write operation signal, which may be based on the write command. As explained above, the ODT enable circuit 140 may provide the asserted ODTEN signal to an input of the ODT enable latch 162 via the ODT tree 150. Responsive to the ODT signal being asserted, the clock signal control circuit 120 may be configured to provide the CLK signal to the ODT enable latch 162 via the clock tree 130. The ODT enable latch 162 may be clocked by the CLK signal to provide the asserted ODTEN signal to the ODT circuitry 170. While write commands continue to be received within a consecutive write command period (e.g., write commands are consecutive), the ODTEN signal may remain asserted from the ODT enable circuit 140. The consecutive write command period may be a count of cycles of the CLK signal. In an embodiment, the count of cycles of the CLK signal may be a specific number of cycles. In some embodiments, the count of cycles may be a range of cycles. For example, the count of cycles of the CLK signal may be four clock cycles or may be a range of four to six cycles. The consecutive write command period may be any number of clock cycles, such as one clock cycle or more than 6 clock cycles. As will be described further with reference to FIG. 2, the WRDT circuit 110 may be configured to detect whether a next write command is received within a consecutive write command period (e.g., the next write command is considered a consecutive write command). Responsive to detection of the consecutive write command, the WRDT circuit 110 may be configured to assert the CWCD signal. Responsive to the asserted CWCD signal, the clock signal control circuit 120 may be configured to disable the CLK signal provided to the ODT enable latch 162. The CLK signal may be disabled, for example, and have a constant level (in contrast to being enabled, for example, and toggle between levels). Thus, the ODT enable latch 162 is not clocked by the disabled CLK signal and may continue to provide the asserted ODTEN signal to the ODT circuitry 170, as the ODTEN signal remains asserted for consecutive write commands.

The ODT enable circuit 140 may be configured to de-assert the ODTEN signal responsive to the write operation signal indicating no further write commands. Prior to the ODT enable circuit 140 de-asserting the ODTEN signal, the WRDT circuit 110 may be configured to de-assert the CWCD signal responsive to not detecting a next write command within the consecutive write command period. The clock signal control circuit 120 may be configured to enable the CLK signal (e.g., to toggle between levels) provided to the ODT enable latch 162 responsive to the de-asserted CWCD signal. Thus, the ODT enable latch 162 may be clocked by the enabled CLK signal and provide the de-asserted ODTEN signal received from the ODT enable circuit 140 (via the ODT tree 150) to the ODT circuitry 170 responsive to the enabled CLK signal.

Disabling the CLK signal provided through the clock tree 130 to the ODT enable latch 162 during execution of consecutive write commands may reduce power consumption. By detecting whether a next write command is received within the consecutive write command period after a current write command, the WRDT circuit 110 may be able to de-assert the CWCD signal (and, accordingly, the clock signal control circuit 120 configured to enable the CLK signal provided to the ODT enable latch 162) prior to the de-asserted ODTEN signal being received at the ODT enable latch 162 from the ODT enable circuit 140. Thus, the ODT enable latch 162 may be configured to provide the de-asserted ODTEN signal to the ODT circuitry 170 associated with the I/O node 180 in correct time responsive to the CLK signal.

Figure 2:
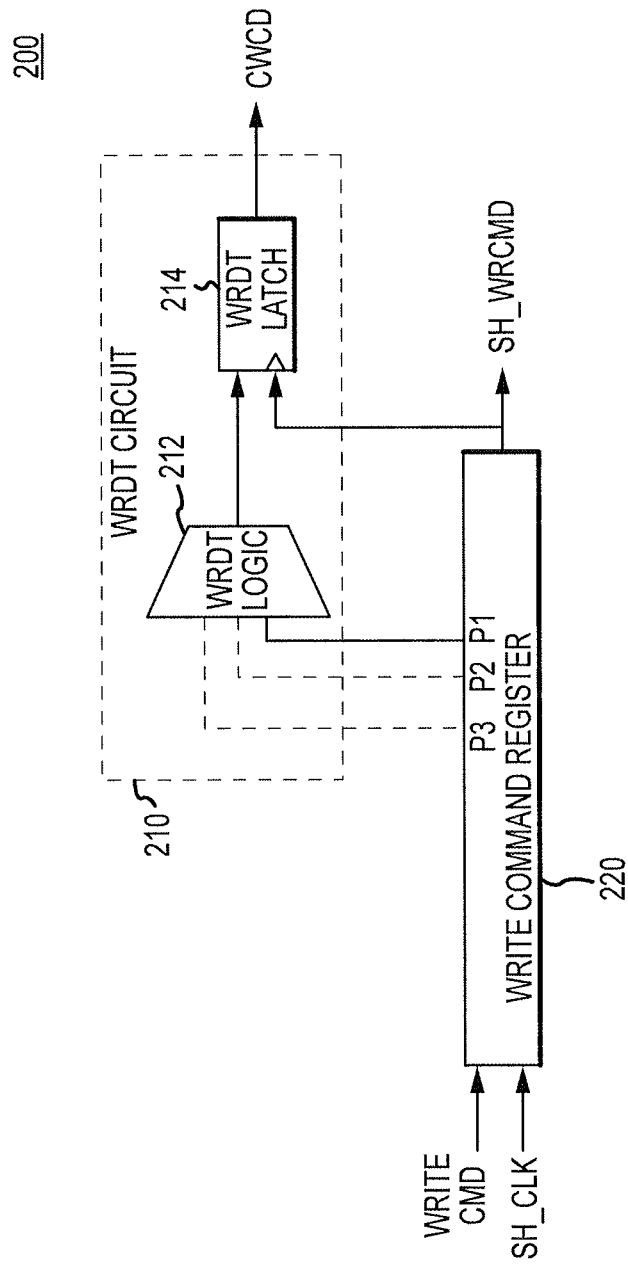
FIG. 2 is a block diagram of a particular illustrative embodiment of an apparatus including a consecutive write detection circuit.

Referring to FIG. 2, a particular illustrative embodiment of an apparatus including a consecutive write command detected circuit is disclosed and generally designated 200. The apparatus 200 may include a consecutive write command detection circuit WRDT 210 that detects whether consecutive write commands have been received. The WRDT circuit 210 may be used for the WRDT circuit 110 of the embodiment of FIG. 1. The WRDT circuit 210 may include WRDT logic 212 and a WRDT latch 214. The WRDT circuit 210 may be coupled to a write command register 220. The write command register 220 is configured to receive a write command WRITE CMD, shift the WRITE CMD through the register, and provide a shifted write command SH_WRCMD. The write command register 220 may be a shift register that shifts the WRITE CMD through shift stages (not shown) responsive to a SH_CLK signal. The write command register 220 may provide the SH_WRCMD to the WRDT latch 214, that may be clocked by the SH_WRCMD. The WRDT latch 214 provides a consecutive write command detected signal CWCD indicative of whether consecutive write commands have been received.

The write command register 220 may further provide a signal or signals P1-P3 to the WRDT logic 212 that are indicative of the presence of a WRITE CMD in the write command register 220. The P1-P3 signals indicate the presence of a WRITE CMD at different positions (e.g., present at different shift stages of a shift register) of the write command register 220. For example, an asserted P1 signal may indicate that a WRITE CMD is present at a first position (e.g., at a shift stage A) of the write command register 220. An asserted P2 signal may indicate that a WRITE CMD is present at a second position (e.g., at a shift stage B, earlier in the write command register than shift stage A) of the write command register 220. An asserted P3 signal may indicate that a WRITE CMD is present at a third position (e.g., at a shift stage C, earlier in the write command register than shift stage B) of the write command register 220. The P1-P3 signals may be used to determine the positions of a WRITE CMD or WRITE CMDs in the write command register 220 relative to the SH_WRCMD. For example, the WRDT logic 212 provides a signal to the WRDT latch 214 based on the P1-P3 signals that indicates whether a WRITE CMD in the write command register 220 is within the consecutive write command period relative to the SH_WRCMD.

In operation, the write command register 220 may be configured to receive write commands WRITE CMD and provide shifted write commands SH_WRCMD. The WRDT logic 212 may be configured to receive the P1-P3 signals indicative of the presence of a WRITE CMD at one or more positions of the write command register 220. For example, the one or more positions of the write command register 220 may be positions corresponding to a count of positions from the output of the write command register 220 that are equal to the count of clock cycles included in a consecutive write command period. In an embodiment, the WRDT logic 212 may be configured to receive a single signal (e.g., the P1 signal) from the write command register 220. In alternate embodiments, the WRDT logic 212 may be configured to receive signals two or more signals from the write command register 220, such as P1, P2, and/or P3 signals. Responsive to the SH_WRCMD, the WRDT latch 214 is clocked and the CWCD signal provided by the WRDT latch 214 has a state indicative of whether consecutive write commands have been received, as based on, for example, the P1-P3 signals that indicate the presence of a write command at the respective positions of the write command register 220.

Figure 3:
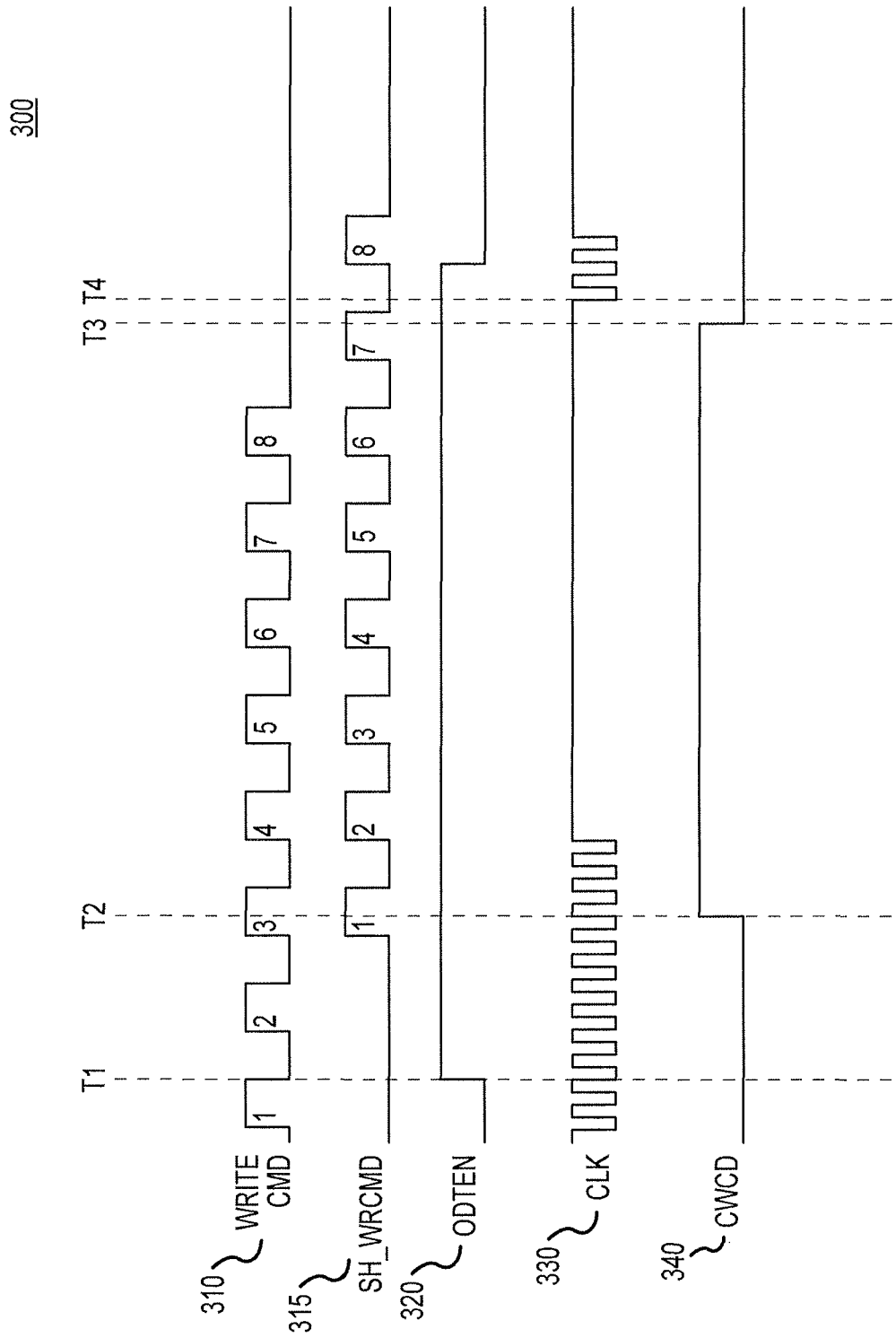
FIG. 3 is an exemplary timing diagram of a particular illustrative embodiment of controlling a clock signal during execution of consecutive write commands.

Referring to FIG. 3, an exemplary timing diagram of a particular illustrative embodiment of a consecutive write command detection is disclosed and generally designated 300. For example, the exemplary timing diagram 300 may illustrate timing characteristics of the apparatus 100 of FIG. 1 and/or the apparatus 200 of FIG. 2. The timing diagram 300 depicts controlling (e.g., disabling and enabling) a clock signal CLK 330 to provide an on-die termination (ODT) enable signal ODTEN 320 based on consecutive write commands. A write command signal WRITE CMD 310 may depict a plurality of write commands. The shifted write command signal SH_WRCMD 315 may depict the WRITE CMD signal 310 at an output of a write command register, such as the write command register 220 of FIG. 2. The CLK signal 330 may depict the CLK signal provided by the clock signal control circuit 120 of FIG. 1. The ODTEN signal 320 may depict the ODTEN signal provided by the ODT enable circuit 140 of FIG. 1. The consecutive write command detected signal CWCD 320 may depict the CWCD signal provided by the WRDT circuit 110 of FIG. 1 and/or the WRDT circuit 210 of FIG. 2.

A first write command of the plurality of consecutive write commands may be received via the WRITE CMD signal 310 prior to time T1. At time T1, the ODT enable signal ODTEN is asserted responsive to the first write command. A clock signal CLK 330 toggles to facilitate provision of the ODTEN signal to ODT circuitry associated with an input/output (I/O) node, such as the I/O node 180 of FIG. 1. The first shifted write command of the SH_WRCMD signal 315 corresponding to the first write command of the WRITE CMD signal 310 is provided at an output of the write command register at a time prior to T2. Responsive to the first shifted write command, a consecutive write command detection circuit, such as the WRDT circuit 110 of FIG. 1 or the WRDT circuit 210 of FIG. 2, may detect whether a next write command is received by the write command register within a consecutive write command period (e.g., detect a consecutive write command). A time T2, the consecutive write command detected signal CWCD 340 is asserted responsive to detection of the consecutive write command (e.g., the second WRITE CMD). Between time T2 and time T3, the plurality of consecutive write commands are provided through the write command register, as depicted by the SH_WRCMD signal 315. During this time the ODTEN signal and the CWCD signal remain asserted. Responsive to the asserted CWCD signal, a clock signal control circuit, such as clock signal control circuit 120, disables the CLK signal (e.g., the CLK signal does not toggle).

Prior to time T3, a last shifted write command of the SH_WRCMD signal 315 corresponding to a last write command of the plurality of write commands of the WRITE CMD signal 310 is provided at the output of the write command register. At time T3, responsive to the last shifted write command, the consecutive write detection circuit de-asserts the CWCD signal 340 responsive to not detecting a next write command within the consecutive write command period. At time T4, the CLK 330 signal begins toggling responsive to the CWCD signal 340 being de-asserted. After time T4, the ODTEN signal 320 may be de-asserted responsive to elapsing of the consecutive write command time period without a next write command. The de-asserted ODTEN signal 320 is provided to ODT circuitry associated with the I/O node responsive to the CLK signal 330.

The exemplary timing diagram 300 is a non-limiting illustration to provide a sufficient understanding of embodiments of the disclosure. Those of ordinary skill in the art will appreciate that the relative timing of the signals of the exemplary timing diagram 300 may vary from system to system. For example, a time delay between a write command being received at a write command register to a time a shifted write command is provided at an output of the write command register may be more or less than eight clock cycles. Further, write commands may be considered consecutive based on a time gap of more than four clock cycles or less than four clock cycles.

Figure 4:
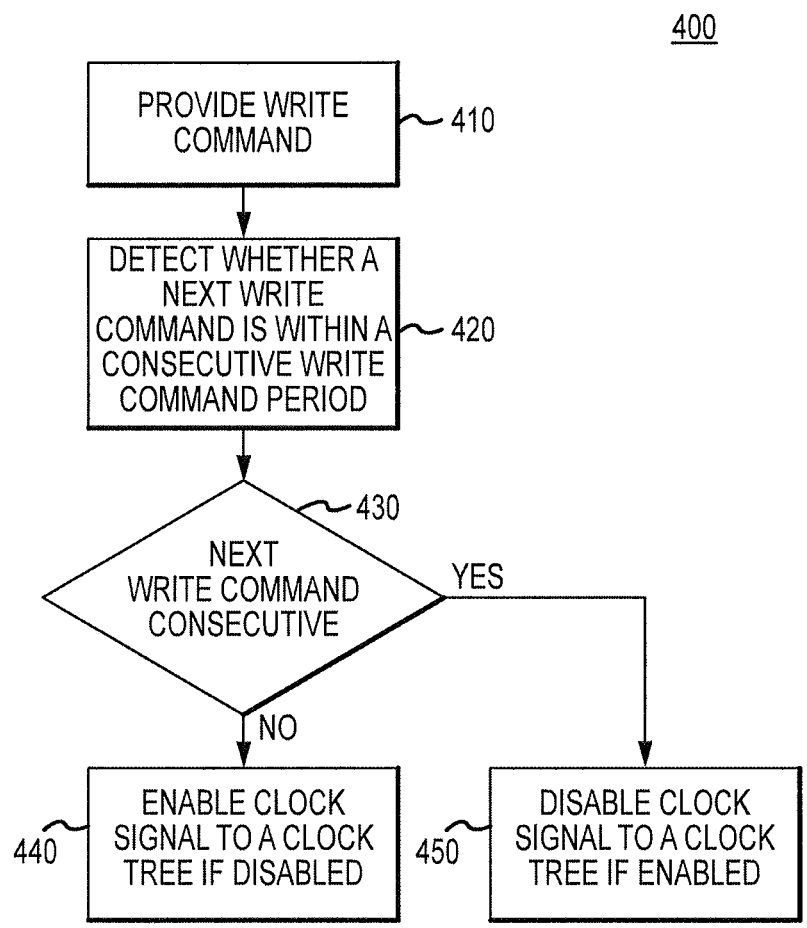
FIG. 4 a flow diagram of a particular illustrative embodiment of a method of controlling a clock signal during execution of consecutive write commands.

Referring to FIG. 4, a flow diagram of a particular illustrative embodiment of a method of controlling a clock signal during execution of consecutive write commands is designated 400. The method 400 may be performed by the apparatus 100 of FIG. 1 and/or the apparatus 200 of FIG. 2.

The method 400 may include providing a write command at step 410. The write command may be provided at an output of a write command register, such as the write command register 220 of FIG. 2. The method 400 may further include detecting whether a next write command is within a consecutive write command period responsive to the write command being provided at step 420. Detecting whether a next write command is within a consecutive write command period may be performed by the WRDT circuit 110 of FIG. 1 and/or the WRDT circuit 210 of FIG. 2. In an embodiment, detecting whether the next write command is within the consecutive write command period may include receiving a signal indicative of the presence of write commands in the write command register. The signal may indicate a presence of a write command at a position of the write command register. The position of the write command register may include a position corresponding to a count of positions from the output of the write command register that is equal to the count of clock cycles included in a consecutive write command period. Detecting whether the next write command is within the consecutive write command period responsive to the write command being provided may include providing a consecutive write command detected signal to a clock signal control circuit via a latch. The latch may be clocked responsive to the write command provided at step 410. The consecutive write command detected signal may be based on the signals from the write command register indicating that the next write command is within the consecutive write command period.

The method 400 may further include receiving a clock signal at the clock signal control circuit. The method 400 may further include controlling the clock signal based on whether the next write command is within the consecutive write command period. In an embodiment, the method 400 may include enabling the clock signal, at step 440, responsive to failing to detect the next write command within the write command period, at step 430. The method 400 may include disabling the clock signal, at step 450, responsive to detecting the next write command within the write command period, at step 430. In an embodiment, the clock signal may be provided by a clock tree control circuit, such as the clock signal control circuit 120 of FIG. 1.

Figure 5:
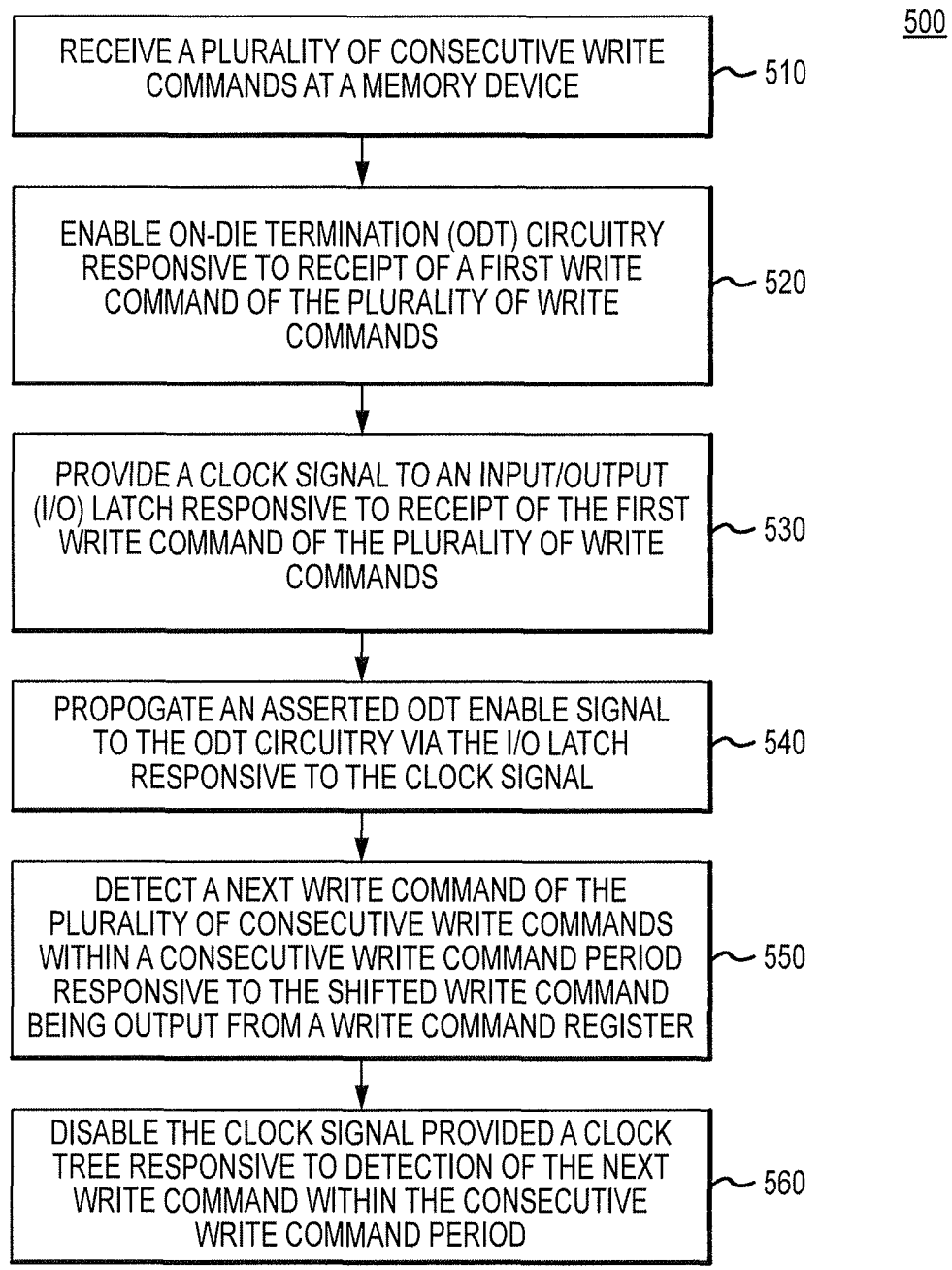
FIG. 5 a flow diagram of a particular illustrative embodiment of a method of controlling a clock signal during execution of consecutive write commands.

Referring to FIG. 5, a flow diagram of a particular illustrative embodiment of a method of controlling a clock signal during execution of consecutive write commands is designated 500. The method 500 may be performed by the apparatus 100 of FIG. 1 and/or the apparatus 200 of FIG. 2.

The method 500 includes receiving a plurality of consecutive write commands at a memory device, at step 510. The memory command may be received at a write command register, such as the write command register 220 of FIG. 2.

The method 500 may further include enabling an on-die termination (ODT) circuitry responsive to receipt of a first write command of the plurality of write commands, at step 520. The ODT enable signal may be asserted by an ODT enable circuit, such as the ODT enable circuit 140 of FIG. 1.

The method 500 may further include providing an enabled clock signal to an ODT enable latch, such as the ODT enable latch 162 of FIG. 1, responsive to receipt of the first write command of the plurality of write commands, at step 530. The clock signal may be provided by a clock signal control circuit, such as the clock signal control circuit 120 of FIG. 1 via a clock tree, such as the clock tree 130 of FIG. 1. The method 500 may further include propagating an asserted ODT enable signal to an I/O node via an I/O latch responsive to the clock signal, at step 540.

The method 500 may further include detecting a next write command of the plurality of consecutive write commands within a consecutive write command period responsive to the shifted write command being output from a write command register, at step 550. In some embodiments, the consecutive write command period may include four to six cycles of the clock signal. Detecting the next write command within the consecutive write command period may be performed by the WRDT circuit 110 of FIG. 1 and/or the WRDT circuit 210 of FIG. 2. The method 500 may further include disabling the clock signal provided to a clock tree responsive to detection of the next consecutive write command signal within a consecutive write command period, at step 560. The clock signal control circuit 120 of FIG. 1 may disable the clock signal being provided.

The method 500 may further include receiving a last write command of the plurality of consecutive write commands at an output of the write command register. The method 500 may further include detecting that a next write command of the plurality of write commands is not within the consecutive write command period. The method 500 may further include providing the clock signal provided to the I/O latch responsive to not detecting a next write command within the consecutive write command period. The method 500 may further include providing the de-asserted ODT enable signal to the ODT circuitry associated with the I/O node responsive to the clock signal.

The method 400 and the method 500 may be implemented by a field-programmable gate array (FPGA) device, an application-specific integrated circuit (ASIC), a processing unit such as a central processing unit (CPU), a digital signal processor (DSP), a controller, another hardware device, a firmware device, or any combination thereof. As an example, the method 400 of FIG. 4 and/or the method 500 of FIG. 5 can be initiated by a processor that executes instructions by providing an enable signal to the control circuit.

Figure 6:
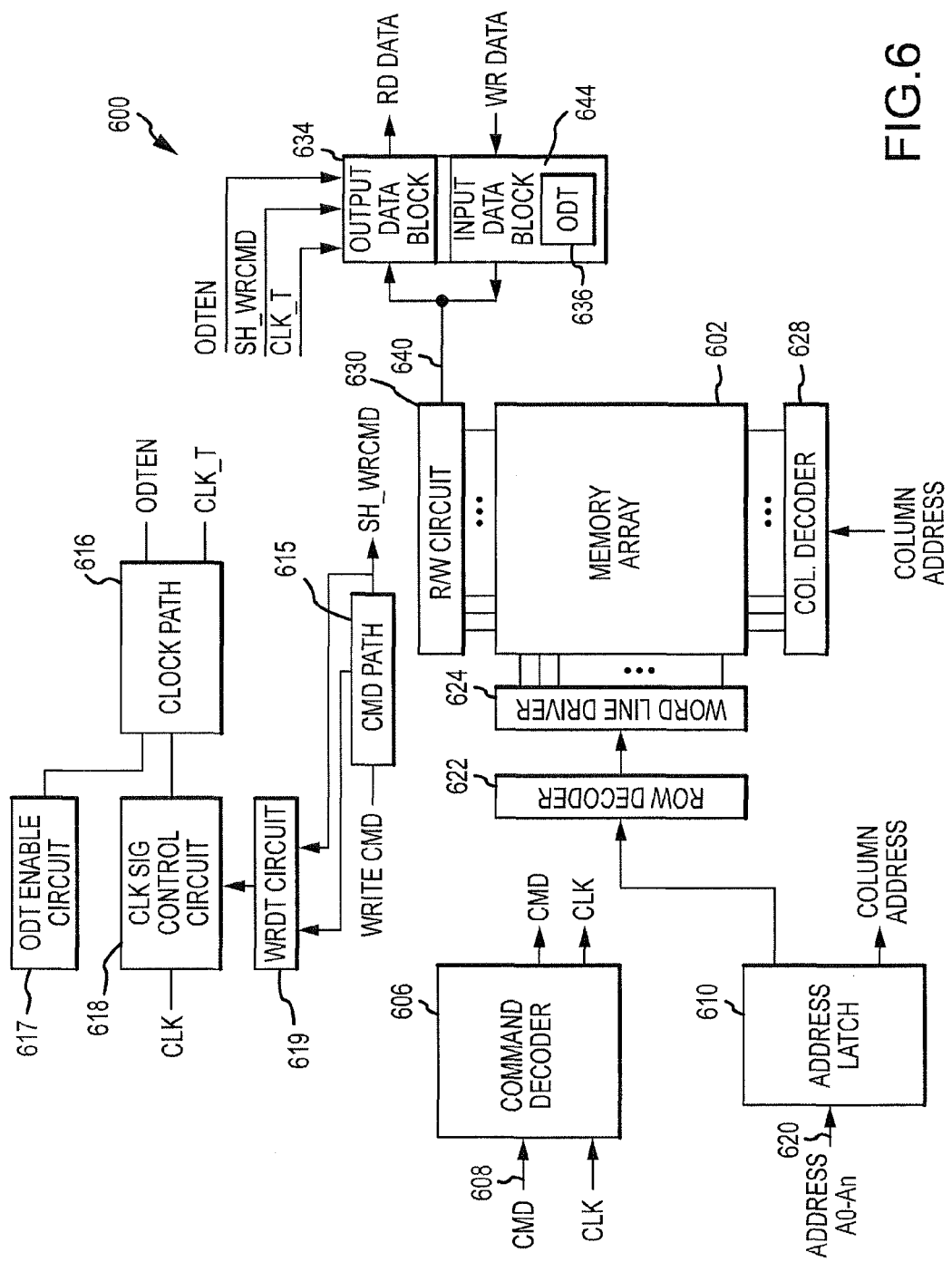
FIG. 6 is a block diagram of a memory including a consecutive write command detection circuit according to an embodiment of the disclosure.

Referring to FIG. 6, a block diagram of a memory 600 including a consecutive write command detection circuit according to an embodiment is illustrated. The a memory 600 may include a memory array 602 of memory cells, which may be, for example, dynamic random-access memory (DRAM) memory cells, static random-access memory (SRAM) memory cells, flash memory cells, or some other types of memory cells. The memory 600 includes a command decoder 606 that may receive memory commands through a command bus 608 and provide (e.g., generate) corresponding control signals within the memory 600 to carry out various memory operations. Row and column address signals may be provided (e.g., applied) to an address latch 610 in the memory 600 through an address bus 620. The address latch 610 may then provide (e.g., output) a separate column address and a separate row address.

The address latch 610 may provide row and column addresses to a row address decoder 622 and a column address decoder 628, respectively. The column address decoder 628 may select bit lines extending through the memory array 602 corresponding to respective column addresses. The row address decoder 622 may be connected to a word line driver 624 that activates respective rows of memory cells in the memory array 602 corresponding to received row addresses. The selected data line (e.g., a bit line or bit lines) corresponding to a received column address may be coupled to a read/write circuitry 630 to provide read data to an output data block of an I/O interface 634 via an input-output data bus 640. Write data may be provided to the memory array 602 through a data input buffer 644 and the memory array read/write circuitry 630. The command decoder 606 may respond to memory commands provided to the command bus 608 to perform various operations on the memory array 602. In particular, the command decoder 606 may be used to provide internal control signals to read data from and write data to the memory array 602.

The memory 600 further includes command path 615 that may be configured to receive the write commands WRITE CMD and provide a shifted write command SH_WRCMD at an output. The memory 600 may further include a write command detection circuit WRDT 619 coupled to the command path 615. The WRDT circuit may be configured to detect whether a next write command is received within a consecutive write command period (e.g., the next write command is considered a consecutive write command) responsive to a current SH_WRCMD provided at an output of the command path 615. The command path 615 may include the write command register 220 of FIG. 2. The WRDT block 619 may include the WRDT circuit 110 of FIG. 1, the WRDT circuit 210 of FIG. 2, or any combination thereof.

The memory may further include a clock signal control block CLK SIG CTRL 618 and a clock path 616. The CLK SIG CTRL block 618 may be configured to control the CLK signal to the clock path 616 based on a consecutive write command detection CWCD signal received the WRDT block 619. For example, responsive to detection of a consecutive write command, the WRDT block 619 may be configured to assert the CWCD signal, and, responsive to the CWCD signal being asserted, the CLK SIG CTRL block 618 may disable the CLK signal to the clock path 616. The clock path 616 may be configured to provide the CLK_T signal at an output based on the CLK signal received from the CLK SIG CTRL block 618. The CLK SIG CTRL block 618 may include the clock signal control circuit 120 of FIG. 1. The clock path 616 may include the clock tree 130 of FIG. 1.

The memory 600 may further include an ODT enable block 617 configured to provide an ODT enable signal to the clock path 616 responsive to a write operation signal. The write operation signal may be asserted based on the WRITE CMD and/or the SH_WRCMD. The clock path 616 may be further configured to provide an ODTEN-signal at an output. The ODT enable block 617 may include the ODT enable circuit 140 and/or the ODT tree 150 of FIG. 1.

The CLK_T signal may be used by an output data block and an input data block of the I/O interface 634 to synchronize timing to interface with the read/write circuitry 630 and a memory controller (not shown). The output data block of the I/O interface 634 may include an ODT block 636. The ODT block 636 may included ODT circuitry that is enabled and/or disabled based on the ODTEN signal and responsive to the CLK_T signal. The ODT block 636 may include the ODT enable circuit 140, the ODT enable latch 162 of the set of I/O latches 160, and the ODT circuitry 170 of FIG. 1. For example, the ODT block 636 includes and ODT enable latch that is configured to be clocked by the CLK_T signal to propagate the ODTEN signal.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends on the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus, comprising:
    a consecutive write command detection circuit configured to provide a consecutive write command detected signal having a value that is based on whether a next write command is within a write command period of a current write command;
    a clock signal control circuit coupled to the consecutive write command detection circuit and configured to control a clock signal responsive to the value of the consecutive write command detected signal;
    an on-die termination (ODT) enable circuit configured provide an ODT enable signal; and
    an ODT enable latch configured to provide the ODT enable signal provided by the ODT enable circuit to ODT circuitry associated with an I/O node responsive to the clock signal.

2. The apparatus of claim 1, wherein the consecutive write command detection circuit is configured to detect whether a write command register includes the next write command within the write command period of the current write command responsive to the current write command being output from the write command register.

3. The apparatus of claim 1, wherein the consecutive write command detection circuit comprises a latch configured to provide the consecutive write command detected signal to the clock signal control circuit, wherein the latch is configured to provide the consecutive write command detected signal having an asserted value responsive to detecting the write command register includes the next write command within the write command period of the write command.

4. The apparatus of claim 3, wherein the asserted value of the consecutive write command detected signal is based on data received from a position of the write command register.

5. The apparatus of claim 1, wherein the ODT enable circuit is configured to assert the ODT enable signal responsive to a start of a write operation and is further configured to de-assert the ODT enable signal responsive to an end of a write operation.

6. The apparatus of claim 5, wherein the clock signal control circuit is configured to enable the clock signal responsive to a de-asserted consecutive write command detected signal and to disable the clock signal responsive to an asserted consecutive write command detected signal.

7. A method, comprising:
    receiving a plurality of write commands at a memory device;
    enabling on-die termination (ODT) circuitry responsive to receipt of a first write command of the plurality of write commands;
    detecting a next write command of the plurality of write commands within a consecutive write command period responsive to the first write command being output from a write command register; and
    disabling a clock signal provided to a clock tree responsive to detection of the next write command signal within a consecutive write command period.

8. The method of claim 7, further comprising:
    providing the clock signal to an input/output (I/O) latch responsive to receipt of the first write command of the plurality of write commands; and
    propagating an asserted ODT enable signal to an I/O node via an I/O latch responsive to the clock signal.

9. The method of claim 7, further comprising:
    receiving a last write command of the plurality of consecutive write commands at an output of the write command register;
    providing the clock signal to the I/O latch responsive to not detecting a next write command within the consecutive write command period; and
    providing a de-asserted ODT enable signal to the ODT circuitry associated with the I/O node responsive to the clock signal.

10. The method of claim 7, further comprising:
    detecting a next write command of the plurality of write commands is not within the consecutive write command period; and
    enabling the clock signal provided to the clock tree.

11. An apparatus comprising:
    an on-die termination (ODT) enable latch configured to latch an ODT enable signal each time a clock signal is asserted;
    a write command detection circuit configured to output a detection signal when consecutive assertion of a plurality of write commands are detected; and
    a control circuit configured to stop asserting the clock signal responsive, at least in part, to the detection signal.

12. The apparatus as claimed in claim 11, further comprising an ODT enable circuit configured to assert the ODT enable signal responsive, at least in part, to initiation of a write operation.

13. The apparatus as claimed in claim 12, wherein the ODT enable circuit is further configured to de-assert the ODT enable signal responsive, at least in part, to termination of the write operation.

14. The apparatus as claimed in claim 13, wherein the write operation comprises a plurality of write cycles based on the plurality of write commands.

15. The apparatus as claimed in claim 11, wherein the write command detection circuit comprises a register configured to receive and store a write command.

16. The apparatus as claimed in claim 15, wherein the write command detection circuit outputs the detection signal when the plurality of write commands are stored in the register.

17. The apparatus as claimed in claim 11, further comprising an ODT circuitry coupled to the ODT enable latch to perform an ODT operation in response, at least in part, to the ODT enable latch latching the ODT enable signal.

* * * * *